(12) United States Patent
Lee

(10) Patent No.: US 10,458,838 B2
(45) Date of Patent: Oct. 29, 2019

(54) EXERCISE MEASURING DEVICE, EXERCISE APPARATUS HAVING SAME, AND EXERCISE MEASURING METHOD

(71) Applicant: Ki Won Lee, Seoul (KR)

(72) Inventor: Ki Won Lee, Seoul (KR)

( * ) Notice: Subject to any disclaimer, the term of this patent is extended or adjusted under 35 U.S.C. 154(b) by 141 days.

(21) Appl. No.: 15/571,743

(22) PCT Filed: May 2, 2016

(86) PCT No.: PCT/KR2016/004574
§ 371 (c)(1),
(2) Date: Nov. 3, 2017

(87) PCT Pub. No.: WO2016/178497
PCT Pub. Date: Nov. 10, 2016

(65) Prior Publication Data
US 2018/0156657 A1    Jun. 7, 2018

(30) Foreign Application Priority Data
May 6, 2015  (KR) .................. 10-2015-0063211

(51) Int. Cl.
*A63B 21/072*    (2006.01)
*G01G 19/52*    (2006.01)
(Continued)

(52) U.S. Cl.
CPC .......... *G01G 19/52* (2013.01); *A63B 21/0724* (2013.01); *A63B 21/0728* (2013.01);
(Continued)

(58) Field of Classification Search
CPC ............ A63B 21/0724; A63B 21/0728; A63B 24/0062; A63B 24/0087; A63B 2209/08; A63B 2209/10; A63B 2220/16; A63B 2220/17; A63B 2220/40; A63B 2220/803; A63B 2225/54; G10C 19/00; G10G 19/52; G01P 13/00; G01P 15/14; G01R 33/02; G01V 15/00; G08C 17/02
See application file for complete search history.

(56) References Cited

U.S. PATENT DOCUMENTS 10,065,076 B2 *  9/2018  Davis ................ A63B 24/0075
2019/0015694 A1 *  1/2019  Klinghult ................ H04Q 9/00
(Continued)

FOREIGN PATENT DOCUMENTS

JP        10-230021 A       9/1998
JP       2005-267179 A      9/2005
(Continued)

*Primary Examiner* — Megan Anderson
(74) *Attorney, Agent, or Firm* — Novick, Kim & Lee, PLLC; Sang Ho Lee

(57) ABSTRACT

An embodiment of the present invention discloses an exercise measuring device attachable to and detachable from a bar of an exercise apparatus, the exercise measuring device including: a main body; a coupling portion formed on the main body and configured to be coupled to at least an end portion of the bar; and a reader formed on the main body, wherein when a weight portion including a tag is fitted to the end portion of the bar, the reader detects a weight of the weight portion fitted to the bar by reading the tag of the weight portion.

14 Claims, 2 Drawing Sheets

(51) Int. Cl.
*G01C 19/00* (2013.01)
*G01P 13/00* (2006.01)
*G01P 15/14* (2013.01)
*G01R 33/02* (2006.01)
*G01V 15/00* (2006.01)
*G08C 17/02* (2006.01)
*A63B 24/00* (2006.01)

(52) U.S. Cl.
CPC .............. *G01C 19/00* (2013.01); *G01P 13/00* (2013.01); *G01P 15/14* (2013.01); *G01R 33/02* (2013.01); *G01V 15/00* (2013.01); *A63B 24/0062* (2013.01); *A63B 24/0087* (2013.01); *A63B 2209/08* (2013.01); *A63B 2209/10* (2013.01); *A63B 2220/16* (2013.01); *A63B 2220/17* (2013.01); *A63B 2220/40* (2013.01); *A63B 2220/803* (2013.01); *A63B 2225/54* (2013.01); *G08C 17/02* (2013.01)

(56) References Cited

U.S. PATENT DOCUMENTS

2019/0091544 A1* 3/2019 Huang ............... A63B 71/0622
2019/0160335 A1* 5/2019 Bengtsson ......... A63B 24/0062

FOREIGN PATENT DOCUMENTS

| JP | 2011-136131 A | 7/2011 |
|---|---|---|
| KR | 10-1997-0007698 A | 2/1997 |
| KR | 10-1224546 B1 | 1/2013 |
| KR | 10-2014-0120758 A | 10/2014 |

* cited by examiner

EXERCISE MEASURING DEVICE, EXERCISE APPARATUS HAVING SAME, AND EXERCISE MEASURING METHOD

TECHNICAL FIELD

Embodiments of the present invention relate to an exercise measuring device, an exercise apparatus including the exercise measuring device, and an exercise measuring method.

BACKGROUND ART

In recent years, as social interest in beauty and health has increased, an increasing number of people have been taking care of their health and continuing to weight train to improve muscle strength and create a well-balanced body. Weight training is exercise that involves using heavy objects such as barbells or dumbbells to train muscles and thereby improve physical strength.

Although individuals have different physical conditions, people use the same exercise equipment and methods and perform the same amount of exercise. In this case, although people exercise, the efficiency of the exercise may be low, or health problems may occur due to excessive exercise.

In addition, it is very tiresome for people to record the amount of every exercise they have performed, and people easily forget how much exercise they have performed. Thus, people tend to neglect recording their exercise. That is, it is difficult for individuals to check the amount of exercise and exercise methods.

The above-described background art is technical information that the inventor had or learned when or while inventing the present invention and may not be publicly known before the filing of the present patent application.

DETAILED DESCRIPTION OF THE INVENTION

Technical Problem

Embodiments of the present invention provide an exercise measuring device, an exercise apparatus including the exercise measuring device, and an exercise measuring method.

Technical Solution

An embodiment of the present invention discloses an exercise measuring device attachable to and detachable from a bar of an exercise apparatus, the exercise measuring device including: a main body; a coupling portion formed on the main body and configured to be coupled to at least an end portion of the bar; and a reader formed on the main body, wherein when a weight portion including a tag is fitted to the end portion of the bar, the reader detects a weight of the weight portion fitted to the bar by reading the tag of the weight portion.

In the embodiment, the reader may include at least one of an NFC reader, an RFID reader, a bar code reader, and a QR code reader, and the tag may include at least one of an NFC tag, an RFID tag, a bar code, and a QR code.

In the embodiment, whether the weight portion is loaded onto the bar or unloaded from the bar may be determined according to a direction in which the tag moves relative to the reader.

In the embodiment, the coupling portion may include a magnetic member and may be attachable to and detachable from the bar.

In the embodiment, a hole may be formed in the weight portion so that the bar may be inserted therethrough, and the exercise measuring device may be coupled to a side of the bar and may be smaller than the hole.

In the embodiment, the exercise measuring device may further include a sensor capable of measuring movement of the exercise measuring device.

In the embodiment, the sensor may include at least one of a geomagnetic sensor, an acceleration sensor, and a gyro sensor.

In the embodiment, the exercise measuring device may further include a communication unit configured to transmit, to an external device, information about the weight of the weight portion read by the reader or the movement of the exercise measuring device measured by the sensor.

Another embodiment of the present invention discloses an exercise apparatus including: the exercise measuring device of any one of claims 1 to 8; a wearable device mountable on at least a part of a user; and a distance determining unit configured to determine whether a distance between the exercise measuring device and the wearable device is within a predetermined length.

Another embodiment of the present invention discloses an exercise measuring method including: providing an exercise measuring device on at least an end portion of a bar, the exercise measuring device including a reader; and when a weight portion including a tag is fitted to the end portion of the bar, detecting a weight of the weight portion fitted to the bar by reading the tag of the weight portion with the reader of the exercise measuring device.

In the embodiment, the reader may include at least one of an NFC reader, an RFID reader, a bar code reader, and a QR code reader, and the tag may include at least one of an NFC tag, an RFID tag, a bar code, and a QR code.

In the embodiment, the detecting of the weight of the weight portion may include determining, based on a direction in which the tag moves relative to the reader, whether the weight portion is loaded onto the bar or unloaded from the bar.

In the embodiment, the exercise measuring method may further include measuring movement of the exercise measuring device with a sensor.

In the embodiment, the sensor may include at least one of a geomagnetic sensor, an acceleration sensor, and a gyro sensor.

In the embodiment, the exercise measuring method may further include transmitting, to an external device, information about the weight of the weight portion read by the reader or the movement of the exercise measuring device measured by the sensor.

In the embodiment, the exercise measuring method may further include: mounting a wearable device on at least a part of a user; and determining whether a distance between the exercise measuring device and the wearable device is within a predetermined length.

Other aspects, features, and advantages will become apparent and more readily appreciated from the accompanying drawings, claims, and detailed description.

Advantageous Effects of the Invention

According to the exercise measuring device, the exercise apparatus including the exercise measuring device, and the exercise measuring method of the embodiments of the present invention, if the exercise measuring device is attached to a bar, it is possible to automatically measure the type of exercise, weights used for exercise, the number of exercise repetitions, the amount of exercise, etc., thereby providing correct records of exercise and making it easy to manage individuals' exercise.

BEST MODE

Figure 1:
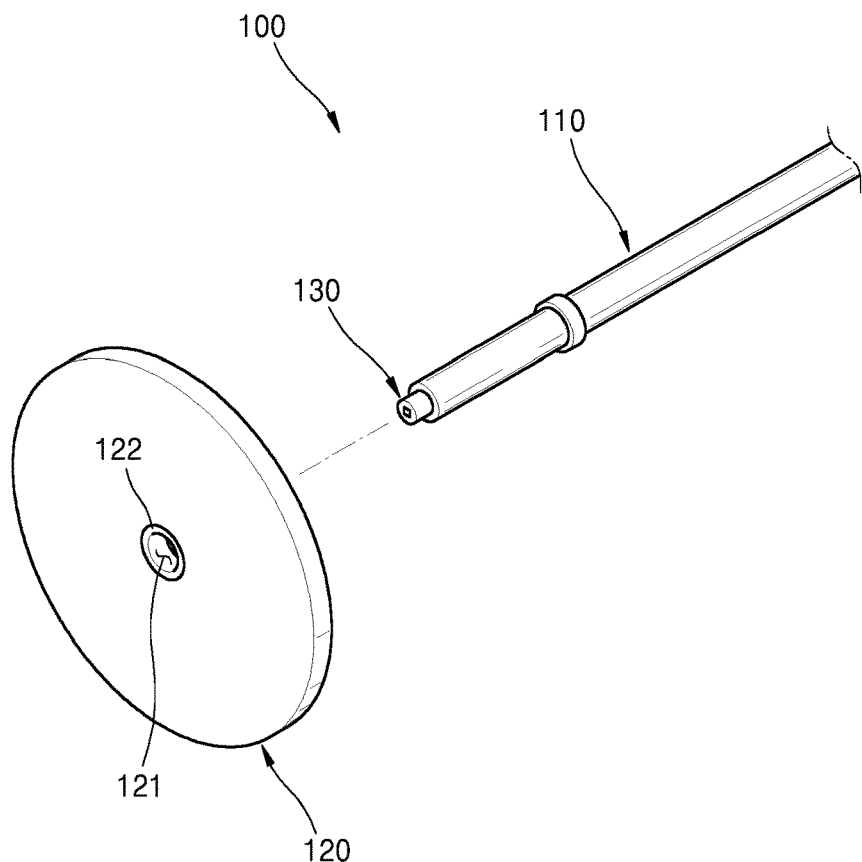
FIG. 1 is a perspective view illustrating an exercise apparatus according to an embodiment of the present invention.

The present invention may be variously modified, and various embodiments may be provided according to the present invention. Hereinafter, some embodiments will be illustrated in the accompanying drawings and described in detail. Effects and features of the present invention, and implementation methods thereof will be clarified through the following embodiments described in detail with reference to the accompanying drawings. However, the present invention is not limited to the following embodiments but may be implemented in various forms. In the following embodiments, it will be understood that although the terms "first," "second," etc. are used to describe various elements, these elements should not be limited by these terms. These terms are only used to distinguish one element from another. The terms of a singular form may include plural forms unless referred to the contrary. In addition, terms such as "include" or "comprise" specify features or the presence of stated elements, but do not exclude other features or elements. In the drawings, the sizes of elements may be exaggerated for clarity. For example, in the drawings, the size or thickness of each element may be arbitrarily shown for illustrative purposes, and thus the present invention should not be construed as being limited thereto.

Hereinafter, embodiments of the present invention will be described in detail with reference to the accompanying drawings. In the following description given with reference to the accompanying drawings, the same elements or corresponding elements are denoted with the same reference numerals, and overlapping descriptions thereof will be omitted.

Figure 2:
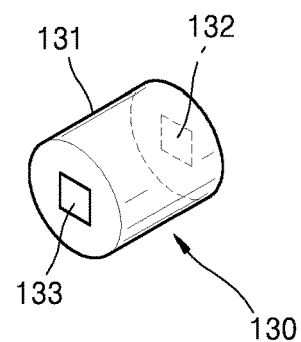
FIG. 2 is a view illustrating an exercise measuring device of the exercise apparatus illustrated in FIG. 1.
Figure 3:
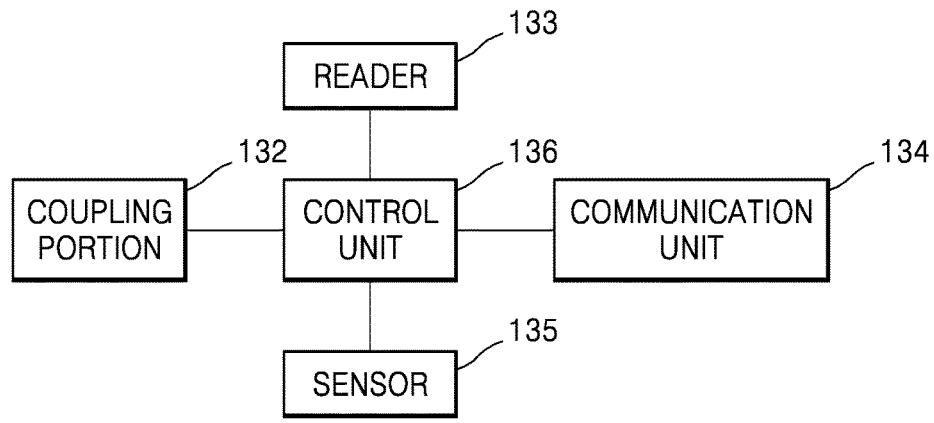
FIG. 3 is a block diagram illustrating the exercise measuring device illustrated in FIG. 2.

FIG. 1 is a perspective view illustrating an exercise apparatus according to an embodiment of the present invention, FIG. 2 is a view illustrating an exercise measuring device of the exercise apparatus illustrated in FIG. 1, and FIG. 3 is a block diagram illustrating the exercise measuring device illustrated in FIG. 2.

Referring to FIGS. 1, 2, and 3, according to the embodiment of the present invention, the exercise apparatus 100 includes a bar 110, a weight portion 120, and an exercise measuring device 130.

The bar 110 has a long bar shape, and at least one weight portion 120 may be fitted to each end of the bar 110. In general, the bar 110 may be formed of a metallic material for coupling with a magnetic member (described later). Alternatively, the bar 110 may be formed of a material that does not couple with a magnetic member, and a portion of the bar 110 for coupling with the magnetic member may be formed of a material which couples with the magnet member. The exercise measuring device 130 may be coupled to at least an end portion of the bar 110.

The weight portion 120 may have a disk form and may provide weight necessary for exercise. A hole 121 having a shape corresponding to the bar 110 is formed in a substantially central portion of the weight portion 120 such that the weight portion 120 may be fitted to each end portion of the bar 110. Weight portions 120 having various weights may be provided. For example, weight portions 120 weighing 5 kg, 10 kg, and 20 kg may be provided.

A tag 122 may further be formed in the hole 121 of the weight portion 120. In this case, the tag 122 may include at least one of an NFC tag, an RFID tag, a bar code, and a QR code.

In detail, when a user exercises using the weight portion 120 and the bar 110, the user may perform exercise with various weights by replacing the weight portion 120 with another weight portion 120. In this case, for regular and continuous exercise, it is necessary to record the daily amount of exercise. In the related art, since there is no device for recording how much exercise has been performed using which weight portion, users have to memorize the weight used for exercise and the number of exercise repetitions, and then record them by hand. However, this recording method is inconvenient and inaccurate because of its dependency on users' memories.

In order to address such problems, according to the embodiment of the present invention, the exercise apparatus 100 characteristically includes the exercise measuring device 130 configured to be coupled to the bar 110, the weight portion 120 including the tag 122, and the exercise measuring device 130 including a reader 133. Therefore, when the weight portion 120 is coupled to the bar 110, the reader 133 of the exercise measuring device 130 may read the tag 122 of the weight portion 120 to automatically detect the weight of the weight portion 120 fitted to the bar 110. In addition, the exercise measuring device 130 characteristically further includes a sensor 135 to detect movements of the exercise measuring device 130, and thereby measures the kind of exercise, the number of exercise repetitions, etc. This will now be described in more detail.

The exercise measuring device 130 may further include a main body 131, a coupling portion 132, the reader 133, a communication unit 134, and the sensor 135.

The main body 131 forms a base of the exercise measuring device 130, and various components may be coupled to the main body 131.

The coupling portion 132 is formed on a side of the main body 131 and serves to provide a coupling force necessary for engagement with the bar 110. For example, the coupling portion 132 may include a magnetic member such as a permanent magnet or an electromagnet, and the magnetic member may be coupled to the bar 110 formed of a metallic material without using an additional coupling member. Alternatively, the coupling portion 132 may be formed using various detachable/attachable materials such as Velcro or an adhesive member.

The reader 133 has a function of detecting the weight of the weight portion 120 fitted to the bar 110 by reading the tag 122 formed on the weight portion 120. The reader 133 may include at least one of an NFC reader, an RFID reader, a bar code reader, and a QR code reader.

In detail, NFC (near field communication), a type of short distance communication such as RFID (radio frequency identification), is a technique for transmitting data between terminals within a short distance of 10 cm by using non-contact-type short distance wireless communication modules at the 13.56 MHz frequency band. In addition to being used for payment, NFC is widely used to transmit information on goods at supermarkets or general stores or transmit travel information necessary for visitors, or for traffic systems, accessing control locks, etc. This NFC (near field communication) technique may be applied to the exercise measuring device 130 to automatically detect and record the weight of the weight portion 120 by reading the tag 122 of the weight portion 120 with the reader 133 of the exercise measuring device 130 formed on an end portion of the bar 110 when the weight portion 120 is fitted to the bar 110.

Alternatively, the tag 122 formed on the weight portion 120 may be a particular identification image, and the reader 133 of the exercise measuring device 130 may be a device capable of recognizing the identification image. Here, the particular identification image may be a bar code or a QR code. The bar code is a code provided by encoding characters or numbers into a combination of black and white bars having different thicknesses so that computers may easily read the information. In addition, as bar codes have come into wide use and the convenience of bar codes has become widely known, demand for various codes such as "codes capable of containing more information," "codes capable of expressing more types of characters," or "codes that can be printed in a smaller space" have increased in the market. In order to cope with such demand and problems, two-dimensional codes have been proposed, and a typical example thereof is a QR code (quick response code). QR codes are a kind of two-dimensional code developed with the main purpose of providing "an easily recognizable code." While bar codes contain information only in one direction, QR codes can contain information in both the horizontal and vertical directions, and thus the amount of recordable information may be markedly increased when QR codes are used. In addition, two-dimensional codes such as PDF417, Data-Matrix, or Maxi Code are being developed. Such two-dimensional codes may contain not only characters but also sounds, photographs, or image information. Thus, when such a two-dimensional code is scanned with a scanner, product information may be displayed or an input website may be connected.

In this case, depending on the direction in which the tag 122 moves relative to the reader 133, it may be determined whether the weight portion 120 is loaded onto or unloaded from the bar 110. That is, when the tag 122 is recognized by the reader 133 while being moved inward from the outside of the bar 110, it may be determined that the weight portion 120 is loaded, and when the tag 122 is recognized by the reader 133 while being moved outward from the bar 110, it may be determined that the weight portion 120 is unloaded.

The sensor 135 may have a function of detecting information such as the type of exercise, the number of exercise repetitions, or the amount of exercise by detecting movements of the exercise measuring device 130. That is, when the exercise measuring device 130 is moved, the sensor 135 may measure values such as acceleration, rotation angle, or position. However, movement values that the sensor 135 may detect are not limited thereto. In detail, the sensor 135 may include a position sensor, an acceleration sensor, a time sensor, a movement sensor, or the like. However, any sensor capable of measuring the movement of the exercise measuring device may be included in addition to the above-mentioned sensors. Specifically, the sensor 135 may include a geomagnetic sensor for sensing direction and position information. In addition, the sensor 135 may include an acceleration sensor for measuring the acceleration of the exercise measuring device 130. In addition, the sensor 135 may include a gyro sensor for measuring values such as the rotation angle, position, or direction of the exercise measuring device 130.

The communication unit 134 may have a function of transmitting information about the weight of the weight portion 120 read by the reader 133 or the movement of the exercise measuring device 130 detected by the sensor 135 to an external server (not shown).

The server (not shown) may store data about exercise methods, exercise poses, exercise amounts, etc. However, any exercise information to be provided to users may be included in the data stored in the server. That is, data of the server is not limited to the above-mentioned items. If the sensor measures the motion of the exercise measuring device, information such as the amount of exercise performed by a user or exercise methods and poses suitable for a user may be extracted.

Although not shown in the drawings, according to an embodiment of the present invention, the exercise apparatus 100 may further include: a wearable device (not shown) mountable on at least a part of a user; and a distance determining unit (not shown) configured to determine whether the distance between the exercise measuring device 130 and the wearable device is within a predetermined length. For example, the wearable device may be a wristband for a user, and the exercise measuring device 130 may be attachable to the wearable device. In this case, the distance determining unit (not shown) may determine the distance between the exercise measuring device 130 and the wearable device, and if the distance is equal to or greater than a certain length, an alarm may be generated. This configuration may prevent a user from losing the exercise measuring device 130 in a case in which the user moves while leaving the exercise measuring device 130 on the bar 110. Alternatively, the wearable device (not shown) may be attached to a user's tennis shoe or the like, and the distance determining unit (not shown) may determine the distance between the exercise measuring device 130 and the wearable device so as to detect, based on variations in the distance, the type of exercise and the number of exercise repetitions that the user performs.

According to the present invention, when the weight portion 120 is coupled to the bar 110, the reader 133 of the exercise measuring device 130 may read the tag 122 of the weight portion 120 to automatically detect the weight of the weight portion 120 fitted to the bar 110, and the sensor 135 may detect movements of the weight portion 120 to measure the number of exercise repetitions. Therefore, if the exercise measuring device 130 is attached to the bar 110, it is possible to automatically measure the type of exercise, weights used for exercise, the number of exercise repetitions, the amount of exercise, etc., thereby providing correct records of exercise and making it easy to manage individuals' exercise.

Mode of the Invention

Figure 4:
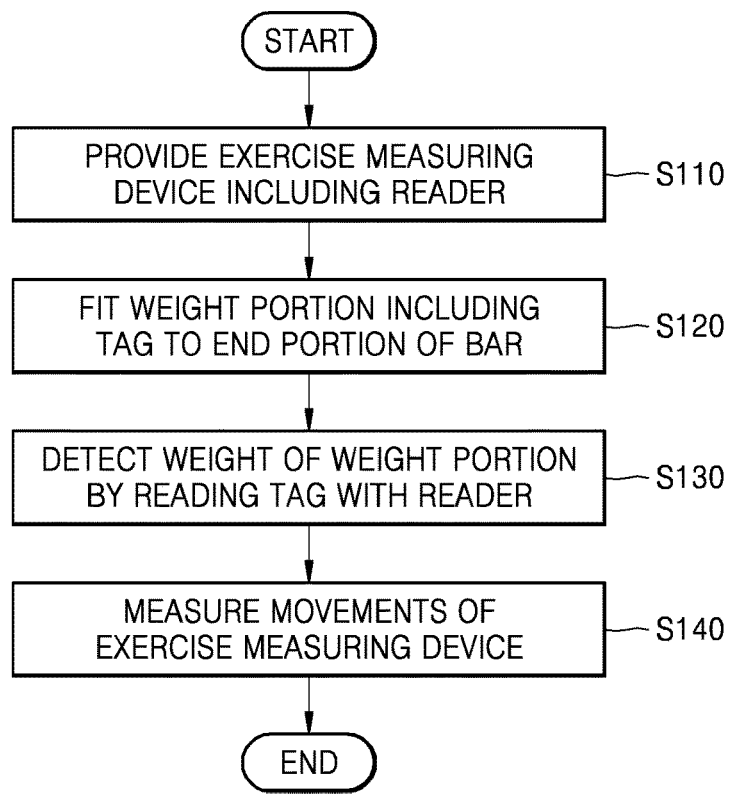
FIG. 4 is a flowchart illustrating an exercise measuring method according to an embodiment of the present invention.

FIG. 4 is a flowchart illustrating an exercise measuring method according to an embodiment of the present invention.

Referring to FIG. 4, the exercise measuring method according to the example embodiment of the present invention includes: an operation S110 in which an exercise measuring device including a reader is provided on at least an end portion of a bar; an operation S120 in which a weight portion including a tag is fitted to the end portion of the bar; an operation S130 in which the reader of the exercise measuring device reads the tag of the weight portion to detect the weight of the weight portion fitted to the bar; and an operation S140 in which movements of the exercise measuring device 130 are measured.

First, the exercise measuring device 130 including the reader 133 is provided on at least an end portion of the bar 110 (operation S110). In detail, a coupling portion 132 is formed on the exercise measuring device 130, and the exercise measuring device 130 is coupled to at least an end portion of the bar 110 by means of a coupling force such as magnetic force provided by the coupling portion 132. For example, the coupling portion 132 may include a magnetic member such as a permanent magnet or an electromagnet, and the magnetic member may be coupled to the bar 110 formed of a metallic material without using an additional coupling member. Alternatively, the coupling portion 132 may be formed using various detachable/attachable materials such as Velcro or an adhesive member.

Next, the weight portion 120 including the tag 122 is fitted to the end portion of the bar 110 (operation S120). The tag 122 may be formed in a hole 121 of the weight portion 120. The tag 122 may include at least one of an NFC tag, an RFID tag, a bar code, and a QR code.

Next, the reader 133 of the exercise measuring device 130 reads the weight of the weight portion 120 fitted to the bar 110 by reading the tag 122 of the weight portion 120 (operation S130). Here, the reader 133 has a function of detecting the weight of the weight portion 120 fitted to the bar 110 by reading the tag 122 formed on the weight portion 120. The reader 133 may include at least one of an NFC reader, an RFID reader, a bar code reader, and a QR code reader.

In this case, depending on the direction in which the tag 122 moves relative to the reader 133, it may be determined whether the weight portion 120 is loaded onto or unloaded from the bar 110. That is, when the tag 122 is recognized by the reader 133 while being moved inward from the outside of the bar 110, it may be determined that the weight portion 120 is loaded, and when the tag 122 is recognized by the reader 133 while being moved outward from the bar 110, it may be determined that the weight portion 120 is unloaded.

Next, movements of the exercise measuring device 130 are measured using a sensor 135 (operation S140). In this case, if the exercise measuring device 130 is moved, the sensor 135 may measure values such as acceleration, rotation angle, or position. However, movement values that the sensor 135 can detect are not limited thereto. Specifically, the sensor 135 may include a geomagnetic sensor for sensing direction and position information. In addition, the sensor 135 may include an acceleration sensor for measuring the acceleration of the exercise measuring device 130. In addition, the sensor 135 may include a gyro sensor for measuring values such as the rotation angle, position, or direction of the exercise measuring device 130.

According to the present invention, when the weight portion 120 is coupled to the bar 110, the reader 133 of the exercise measuring device 130 may read the tag 122 of the weight portion 120 to automatically detect the weight of the weight portion 120 fitted to the bar 110, and the sensor 135 may detect movements of the weight portion 120 to measure the number of exercise repetitions. Therefore, if the exercise measuring device 130 is attached to the bar 110, it is possible to automatically measure the type of exercise, weights used for exercise, the number of exercise repetitions, the amount of exercise, etc., thereby providing correct records of exercise and making it easy to manage individuals' exercise.

While the present invention has been described with reference to the accompanying drawings according to embodiments, these embodiments are for illustrative purposes only, and it will be understood by those of ordinary skill in the art that various changes and modifications may be made therefrom. Therefore, the scope and spirit of the present invention should be defined by the following claims.

INDUSTRIAL APPLICABILITY

Embodiments of the present invention may be applied to exercise measuring devices, exercise apparatuses including exercise measuring devices, and exercise measuring methods.

The invention claimed is:

1. An exercise measuring device comprising:
a main body;
a coupler formed on the main body and configured to be attachable to and detachable from at least an end portion of a bar of an exercise apparatus; and
a reader formed on the main body, wherein when a weight portion comprising a tag is fitted to the end portion of the bar, the reader detects a weight of the weight portion fitted to the bar by reading the tag of the weight portion,
wherein whether the weight portion is loaded onto the bar or unloaded from the bar is determined according to a direction in which the tag moves relative to the reader.

2. The exercise measuring device of claim 1, further comprising a sensor capable of measuring movement of the exercise measuring device.

3. The exercise measuring device of claim 2, wherein the sensor comprises at least one of a geomagnetic sensor, an acceleration sensor, and a gyro sensor.

4. The exercise measuring device of claim 2, further comprising a communication unit configured to transmit, to an external device, information about the weight of the weight portion read by the reader or the movement of the exercise measuring device measured by the sensor.

5. The exercise measuring device of claim 1, wherein the reader comprises at least one of an NFC reader, an RFID reader, and an identification image reader, and the tag comprises at least one of an NFC tag, an RFID tag, and an identification image.

6. The exercise measuring device of claim 1, wherein the coupler comprises a magnetic member and is attachable to and detachable from the bar.

7. The exercise measuring device of claim 1, wherein a hole is formed in the weight portion to receive the bar therethrough, and the exercise measuring device is coupled to a side of the bar and is smaller than the hole.

8. An exercise apparatus comprising:
an exercise measuring device comprising:
a main body;
a coupler formed on the main body and configured to be attachable to and detachable from at least an end portion of a bar of the exercise apparatus; and
a reader formed on the main body, wherein when a weight portion comprising a tag is fitted to the end portion of the bar, the reader detects a weight of the weight portion fitted to the bar by reading the tag of the weight portion;
a device that is wearable on at least a part of a user; and a distance determining unit configured to determine whether a distance between the exercise measuring device and the device is within a predetermined length, wherein the detecting of the weight of the weight portion comprises determining, based on a direction in which the tag moves relative to the reader, whether the weight portion is loaded onto the bar or unloaded from the bar.

9. An exercise measuring method comprising:

providing an exercise measuring device on at least an end portion of a bar, the exercise measuring device comprising a main body, a coupler formed on the main body and configured to be attachable to and detachable from at least an end portion of a bar of an exercise apparatus and a reader; and when a weight portion comprising a tag is fitted to the end portion of the bar, detecting a weight of the weight portion fitted to the bar by reading the tag of the weight portion with the reader of the exercise measuring device, wherein the detecting of the weight of the weight portion comprises determining, based on a direction in which the tag moves relative to the reader, whether the weight portion is loaded onto the bar or unloaded from the bar.

10. The exercise measuring method of claim 9, further comprising measuring movement of the exercise measuring device with a sensor.

11. The exercise measuring method of claim 10, wherein the sensor comprises at least one of a geomagnetic sensor, an acceleration sensor, and a gyro sensor.

12. The exercise measuring method of claim 10, further comprising transmitting, to an external device, information about the weight of the weight portion read by the reader or the movement of the exercise measuring device measured by the sensor.

13. The exercise measuring method of claim 9, wherein the reader comprises at least one of an NFC reader, an RFID reader, and an identification image reader, and the tag comprises at least one of an NFC tag, an RFID tag, and an identification image.

14. The exercise measuring method of claim 9, further comprising:

wearing a device on at least a part of a user; and determining whether a distance between the exercise measuring device and the device is within a predetermined length.

* * * * *